United States Patent
Jeon et al.

(10) Patent No.: US 10,361,727 B2
(45) Date of Patent: Jul. 23, 2019

(54) ERROR CORRECTION ENCODER, ERROR CORRECTION DECODER, AND OPTICAL COMMUNICATION DEVICE INCLUDING THE SAME

(71) Applicant: Electronics and Telecommunications Research Institute, Daejeon (KR)

(72) Inventors: In San Jeon, Daejeon (KR); Hyuk Kim, Daejeon (KR)

(73) Assignee: ELECTRONICS AN TELECOMMUNICATIONS RESEARCH INSTITUTE, Daejeon (KR)

( * ) Notice: Subject to any disclaimer, the term of this patent is extended or adjusted under 35 U.S.C. 154(b) by 215 days.

(21) Appl. No.: 15/360,925

(22) Filed: Nov. 23, 2016

(65) Prior Publication Data
US 2017/0149456 A1  May 25, 2017

(30) Foreign Application Priority Data

Nov. 25, 2015 (KR) .......... 10-2015-0165504
Oct. 31, 2016 (KR) .......... 10-2016-0143563

(51) Int. Cl.
*H03M 13/00* (2006.01)
*H03M 13/29* (2006.01)
(Continued)

(52) U.S. Cl.
CPC ....... *H03M 13/2906* (2013.01); *H03M 13/27* (2013.01); *H03M 13/2927* (2013.01);
(Continued)

(58) Field of Classification Search
CPC ......... H03M 13/1177; H03M 13/1102; H03M 13/1105; H03M 13/2906; H03M 13/27;
(Continued)

(56) References Cited

U.S. PATENT DOCUMENTS 6,442,211 B1 * 8/2002 Hampel .......... H04L 1/0071
375/260
7,519,895 B2  4/2009 Kyung et al.
(Continued)

FOREIGN PATENT DOCUMENTS

KR  10-0918763 B1  9/2009

OTHER PUBLICATIONS

Takashi Mizuochi et al., "Experimental Demonstration of Concatenated LDPC and RS Codes by FPGAs Emulation", IEEE Photonics Technology Letters, Sep. 15, 2009, pp. 1302-1304, vol. 21, No. 18, IEEE.
Steven S. Pietrobon, "Implementation and Performance of a Turbo/Map Decoder", International Journal of Satellite Communications, 1998, pp. 23-46, 16, John Wiley & Sons, Ltd.
(Continued)

*Primary Examiner* — Christine T. Tu

(57) ABSTRACT

Provided is an error correction encoder. The error correction encoder includes input nodes for receiving input words, first encoders for generating first parities by performing a first error correction encoding on each of the input words, an interleaver for generating interleaved words by performing interleaving on the input words, a second encoder for generating a plurality of second parities by performing a second error correction encoding on each of the interleaved words, output nodes for outputting each of the input words, first parity output nodes for outputting the first parities, and second parity output nodes for outputting the second parities.

20 Claims, 9 Drawing Sheets

(51) Int. Cl.
*H04L 1/00* (2006.01)
*H04B 10/50* (2013.01)
*H03M 13/27* (2006.01)
*H03M 13/11* (2006.01)

(52) U.S. Cl.
CPC ........ *H03M 13/6561* (2013.01); *H04B 10/50* (2013.01); *H04L 1/0041* (2013.01); *H04L 1/0045* (2013.01); *H04L 1/0058* (2013.01); *H04L 1/0071* (2013.01); *H03M 13/1102* (2013.01)

(58) Field of Classification Search
CPC .......... H03M 13/2927; H03M 13/6561; H04L 1/0071; H04L 1/0066; H04L 1/0063; H04L 1/0061; H04L 1/0058; H04L 1/0041; H04L 1/0045; H04B 10/50
USPC ........ 714/701, 702, 746, 751–753, 757–758, 714/780, 786, 800, 804
See application file for complete search history.

(56) References Cited

U.S. PATENT DOCUMENTS

| | | |
|---|---|---|
| 7,954,035 B2 | 5/2011 | Chae et al. |
| 8,732,564 B2 | 5/2014 | Chinnici et al. |
| 2008/0273631 A1* | 11/2008 | Gho ............ H04L 1/0041 375/341 |
| 2008/0298511 A1 | 12/2008 | Ryoo et al. |
| 2012/0030544 A1* | 2/2012 | Fisher-Jeffes ..... H03M 13/2957 714/772 |

OTHER PUBLICATIONS

Carlo Condo et al., "Unified Turbo/LDPC Code Decoder Architecture for Deep-Space Communications", IEEE Transactions on Aerospace and Electronics Ststems, Oct. 2014, pp. 3115-3125, vol. 50, No. 4, IEEE.

Zhongfeng Wang et al., "VLSI Design for Low-Density Parity-Check Code Decoding", IEEE Circuits and Systems Magazine, 2011, pp. 52-69, First Quarter 2011, IEEE.

* cited by examiner

ERROR CORRECTION ENCODER, ERROR CORRECTION DECODER, AND OPTICAL COMMUNICATION DEVICE INCLUDING THE SAME

CROSS-REFERENCE TO RELATED APPLICATIONS

This U.S. non-provisional patent application claims priority under 35 U.S.C. § 119 of Korean Patent Application Nos. 10-2015-0165504, filed on Nov. 25, 2015, and 10-2016-0143563, filed on Oct. 31, 2016, the entire contents of which are hereby incorporated by reference.

BACKGROUND

The present disclosure herein relates to a communication device, and more particularly, to an error correction encoder, an error correction decoder, and an optical communication device including the both.

Communication devices transmit/receive signals through wire or wireless channels. While signals are delivered through wire or wireless channels, noise affects the signals due to various reasons. Due to noise, an error that a received signal is not restored to a transmitted signal may occur.

In order to process, compensate, or correct such an error, an error correction encoder and decoder are applied to communication devices. The error correction encoder generates additional information, for example, parity, to correct an error based on a signal to be transmitted. A communication device may transmit/receive an original signal and a signal including parity through a wire or wireless channel. Additionally, an error correction decoder of a communication device detects an original signal part and a parity part from a signal received through a wire or wireless channel, and process, compensate, or correct the original signal part or an error of the original signal part and the parity part by using the parity part An error correction encoder and decoder are also applied to an optical communication device. Compared to other communication methods, optical communication has a relatively high transfer rate and as related technology develops, a communication transfer rate is increased continuously. An error correction encoder and decoder applied to an optical communication device are required to have a high processing speed corresponding to a transfer rate of optical communication. Additionally, in order to increase the reliability of optical communication, an error correction encoder and decoder applied to an optical communication device are required to have a high error correction function. That is, an error correction encoder and decoder having a high processing speed and a high error correction function are required to be applied to an optical communication device.

SUMMARY

The present disclosure provides an error correction encoder and decoder having a high processing speed and a high error correction function and an optical communication device including the same.

An embodiment of the inventive concept provides an error correction encoder including: a plurality of input nodes configured to receive a plurality of input words; a plurality of first encoders configured to generate a plurality of first parities by performing a first error correction encoding on each of the plurality of input words received through the plurality of input nodes; an interleaver configured to generate interleaved words by performing interleaving on the plurality of input words received from the plurality of input nodes; a plurality of second encoders configured to generate a plurality of second parities by performing a second error correction encoding on each of the plurality of interleaved words received from the interleaver; a plurality of output nodes configured to output each of the plurality of input words received through the plurality of input nodes; a plurality of first parity output nodes configured to output each of the plurality of first parities received from the plurality of first encoders; and a plurality of second parity output nodes configured to output each of the plurality of second parities received from the plurality of second encoders.

In an embodiment, each of the first error correction encoding and the second error correction encoding may include Low Density Parity Check (LDPC) encoding.

In an embodiment, each interleaved word may include a part of each of the plurality of input words.

In an embodiment, the error correction encoder may further include a control circuit configured to adjust the number of activation first encoders among the plurality of first encoders, the number of activation second encoders among the plurality of second encoders, and the number of activation inputs and the number of activation outputs of the interleaver.

In an embodiment of the inventive concept, an error correction decoder includes: a plurality of input nodes configured to receive a plurality of input words; a plurality of first error correction decoders configured to perform a first error correction decoding on each of the plurality of input words received through the plurality of input nodes by using a plurality of first parities received through a plurality of first parity input nodes; and an interleaver configured to generate a plurality of interleaved words by performing interleaving on outputs of the plurality of first error correction decoders; and a plurality of second error correction decoders configured to perform a second error correction decoding on each of the plurality of interleaved words received from the interleaver by using a plurality of second parities received through a plurality of second parity input nodes.

In an embodiment, the error correction decoder may further include: a deinterleaver configured to generate a plurality of deinterleaved words by performing deinterleaving on outputs of the plurality of second error correction decoders; and a plurality of adders configured to add the plurality of input words received through the plurality of input nodes and the deinterleaved words received from the deinterleaver, respectively, to deliver the added results to the plurality of first error correction decoders, respectively.

In an embodiment, the each deinterleaved word may include a part of each of outputs of the plurality of second error correction decoders.

In an embodiment, the plurality of first error correction decoders may be configured to perform the first error correction decoding on outputs of the plurality of adders; and when the deinterleaver does not output a valid value, the plurality of adders may be configured to deliver the plurality of input words to the plurality of first error correction decoders, respectively.

In an embodiment, the error correction decoder may further include a plurality of adders configured to deliver values, which are obtained by subtracting the outputs of the deinterleaver from outputs of the plurality of first error correction decoders, to the interleaver.

In an embodiment, the interleaver may be configured to perform interleaving on outputs of the plurality of adders and when the deinterleaver does not output a valid value, the plurality of adders may be configured to deliver the outputs of the plurality of first error correction decoders to the interleaver.

In an embodiment, the error correction decoder may further include a plurality of adders configured to deliver values, which are obtained by subtracting the outputs of the interleaver from the outputs of the plurality of second error correction decoders, respectively, to the deinterleaver, wherein the deinterleaver may be configured to perform deinterleaving on outputs of the plurality of adders.

In an embodiment, the error correction decoder may further include, when the number of delivering outputs to the deinterleaver by the plurality of second error correction decoders reaches a reference value, a plurality of output nodes configured to output each of the outputs of the plurality of second error correction decoders to the outside.

In an embodiment, the error correction decoder may further include a control circuit configured to adjust the number of activation first error correction decoders among the plurality of first error correction decoders, the number of activation inputs and activation outputs of the interleaver, the number of second error correction decoders among the plurality of second error correction decoders, and the number of activation inputs and activation outputs of the deinterleaver.

In an embodiment, each of the first error correction decoding and the second error correction decoding may include iterative decoding for performing error correction a plurality of times.

In an embodiment, each of the first error correction decoding and the second error correction decoding may include Low Density Parity Check (LDPC) decoding.

In an embodiment of the inventive concept, an optical communication device includes: a scrambler configured to perform scramble on a first input word; a parallelizer configured to output a plurality of second input words by parallelizing an output of the scrambler; an error correction encoder configured to perform error correction encoding on the plurality of second input words; and an optical transmitter configured to output an output of the error correction encoder as an optical signal, wherein the error correction encoder includes: a plurality of first encoders configured to generate a plurality of first parities by performing a first error correction encoding on each of the plurality of second input words; an interleaver configured to generate a plurality of interleaved words by performing interleaving on the plurality of second input words; and a plurality of second encoders configured to generate a plurality of second parities by performing a second error correction encoding on each of the plurality of interleaved words received from the interleaver, wherein the error correction encoder is configured to output the plurality of second input words, the plurality of first parities, and the plurality of second parities.

In an embodiment, the optical communication device may further include a serializer configured to reduce the number of outputs of the error correction encoder to match the number of inputs of the optical transmitter and deliver the number to the optical transmitter.

In an embodiment, the error correction encoder may be configured to output each second input word and a first parity and a second parity corresponding to each second input word as each output word.

In an embodiment, the optical communication device may further include: an optical receiver configured to receive a second optical signal; a second parallelizer configured to parallelize an output of the optical receiver as a plurality of third input words; an error correction decoder configured to perform error correction decoding on the plurality of third input words; a serializer configured to serialize outputs of the second error correction decoder as a fourth input word; a descrambler configured to perform descramble on an output of the serializer and output a result, wherein the error correction decoder may include: a plurality of first error correction decoders configured to perform a first error correction decoding on each of the plurality of third input words by using the plurality of first parities; an interleaver configured to generate a plurality of interleaved words by performing interleaving on outputs of the plurality of first error correction decoders; and a plurality of second error correction decoders configured to perform a second error correction decoding on each of the plurality of interleaved words received from the interleaver by using the plurality of second parities.

In an embodiment, the optical communication device may further include: an optical receiver configured to receive second optical signals; a second parallelizer configured to parallelize outputs of the optical receiver as a plurality of third input words; an error correction decoder configured to perform error correction decoding on the plurality of third input words; a serializer configured to serialize outputs of the error correction decoder as a fourth input word; and a descrambler configured to perform descramble on an output of the serializer and output a result, wherein the error correction decoder may include: a plurality of first error correction decoders configured to perform a first error correction decoding on each of the plurality of third input words by using the plurality of first parities; an interleaver configured to generate a plurality of interleaved words by performing interleaving on outputs of the plurality of first error correction decoders; and a plurality of second error correction decoders configured to perform a second error correction decoding on each of the plurality of interleaved words received from the interleaver by using the plurality of second parities.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Hereinafter, it will be described in more detail with reference to the accompanying drawings so that those skilled in the art easily carry out the technical idea of the inventive concept.

Figure 1:
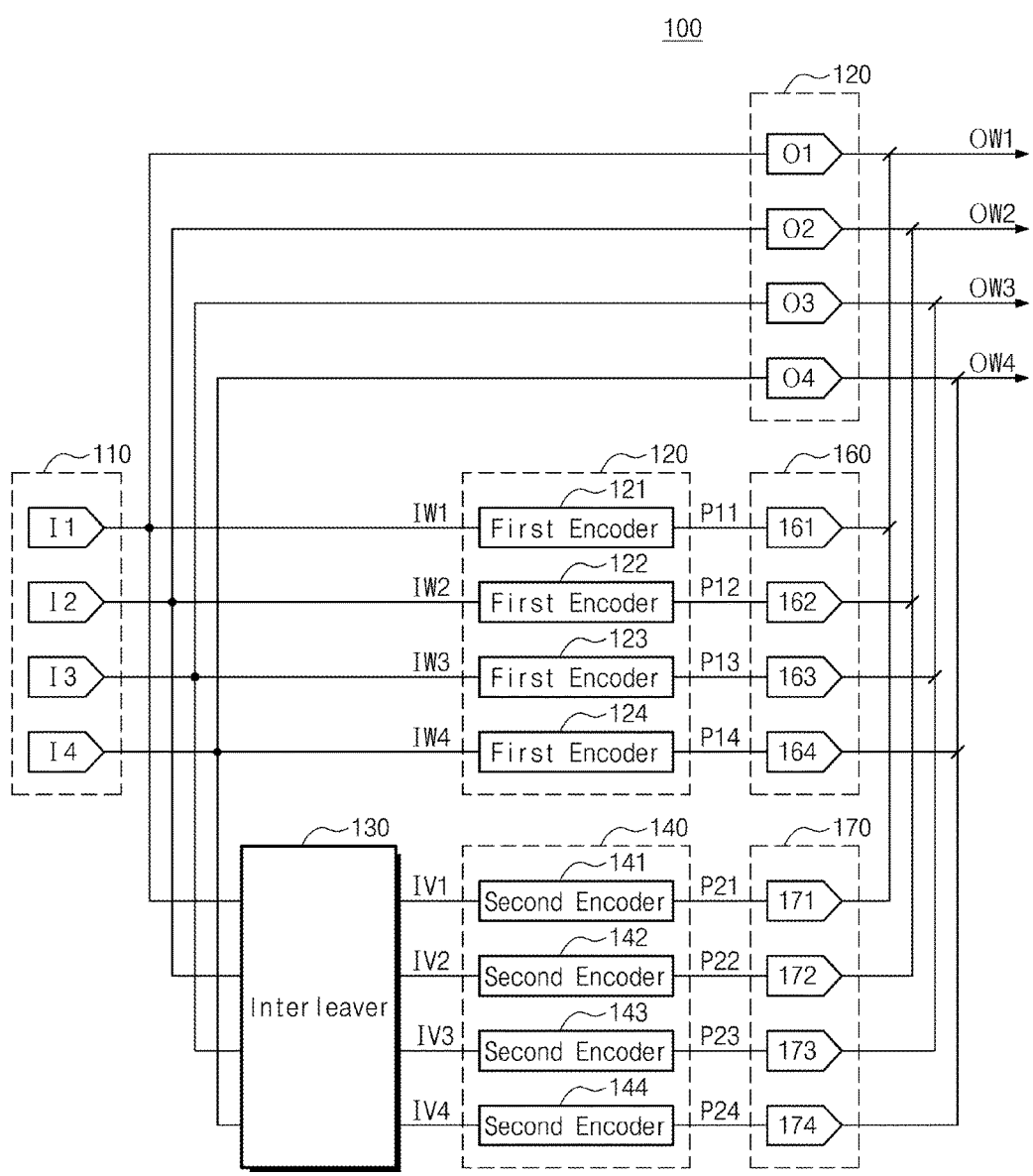
FIG. 1 is a block diagram illustrating an error correction encoder according to an embodiment of the inventive concept.

FIG. 1 is a block diagram illustrating an error correction encoder 100 according to an embodiment of the inventive concept. Exemplarily, the error correction encoder 100 for performing error correction encoding during an error correction process is shown in FIG. 1.

Referring to FIG. 1, the error correction encoder 100 includes an input unit 110, a first encoding unit 120, an interleaver 130, a second encoding unit 140, an output unit 150, a first parity output unit 160, and a second parity output unit 170.

The input unit 110 includes a plurality of input nodes I1 to I4. Each of the plurality of input nodes I1 to I4 is configured to receive an input word from an external device. That is, the plurality of input nodes I1 to I4 may receive a plurality of input words IW1 to IW4 at the same time, respectively. For example, the plurality of input words IW1 to IW4 may be delivered from a data source for generating data to be transmitted through a wire or wireless channel to the plurality of input nodes I1 to I4. The plurality of input words IW1 to IW4 received through the plurality of input nodes I1 to I4 are delivered to the first encoding unit 120, the interleaver 130, and the output unit 150.

The first encoding unit 120 includes a plurality of first encoders 121 to 124 that respectively correspond to the plurality of input nodes I1 to I4. Exemplarily, the plurality of input nodes I1 to I4 and the plurality of first encoders 121 to 124 may have one-to-one corresponding relationship. The plurality of first encoders 121 to 124 may perform a first error correction encoding on each of the plurality of input words IW1 to IW4 received through the plurality of input nodes I1 to I4. For example, each of the first encoders 121 to 124 may perform Low Density Parity Check (LDPC) encoding. The plurality of first encoders 121 to 124 may generate first parities P11 to P14 from the plurality of input words IW1 to IW4, respectively. The first parities P11 to P14 may be additional information generated from the plurality of input words IW1 to IW4 in order for error correction. The first parities P11 to P14 are delivered to the first parity output unit 160.

The interleaver 130 may perform interleaving on the plurality of input words IW1 to IW4 received through the plurality of input nodes I1 to I4 in order to generate a plurality of interleaved words IV1 to IV4. For example, the interleaver 130 may generate one interleaved word by extracting a part from each of the plurality of input words IW1 to IW4. One interleaved word may include parts of each of the plurality of input words IW1 to IW4. Exemplarily, the number of the input words IW1 to IW4 inputted to the interleaver 130 and the number of the interleaved words IV1 to IV4 outputted from the interleaver 130 may be the same. That is, the number of input nodes and the number of output nodes in the interleaver 130 may be the same. The plurality of interleaved words IV1 to IV4 outputted from the interleaver 130 may be delivered to the second encoding unit 140.

The second encoding unit 140 includes a plurality of second encoders 141 to 144 that respectively correspond to the plurality of interleaved words IV1 to IV4. Exemplarily, the plurality of interleaved words IV1 to IV4 and the plurality of second encoders 141 to 144 may have one-to-one corresponding relationship. The plurality of second encoders 141 to 144 may perform second error correction encoding on each of the plurality of interleaved words IV1 to IV4. For example, each of the second encoders 141 to 144 may perform Low Density Parity Check (LDPC) encoding. The plurality of second encoders 141 to 144 may generate second parities P21 to P24 from the plurality of interleaved words IV1 to IV4, respectively. The second parities P21 to P24 may be additional information generated from the plurality of interleaved words IV1 to IV4 in order for error correction. The second parities P21 to P24 are delivered to the second parity output unit 170.

The output unit 150 includes a plurality of output nodes O1 to O4 that respectively correspond to the plurality of input nodes I1 to I4. The plurality of output nodes O1 to O4 may output the plurality of input words IW1 to IW4 delivered from the plurality of input nodes I1 to I4.

The first parity output unit 160 includes a plurality of first parity output nodes 161 to 164 that respectively correspond to the plurality of first encoder 121 to 124. The first parity output nodes 161 to 164 may output the first parities P11 to P14 delivered from the plurality of first encoder 121 to 124, respectively.

The second parity output unit 170 includes a plurality of second parity output nodes 171 to 174 that respectively correspond to the plurality of second encoder 141 to 144. The second parity output nodes 171 to 174 may output the second parities P21 to P24 delivered from the plurality of second encoder 141 to 144, respectively.

Exemplarily, each of the plurality of input words IW1 to IW4 outputted through the output nodes O1 to O4, the plurality of first parities P11 to P14 outputted through the first parity output nodes 161 to 164, and the plurality of second parities P21 to P24 outputted through the second parity output nodes 171 to 174 may form a plurality of output words OW1 to OW4. For example, each input word may form one output word together with a corresponding first parity and a corresponding second parity. The plurality of output words OW1 to OW4 may be transmitted through a wire or wireless channel.

As mentioned above, the error correction encoder 100 according to an embodiment of the inventive concept is configured to perform error correction encoding in parallel on a plurality of input words. Although it is shown in FIG. 1 that error correction encoding is performed on four input words IW1 to IW4, the number of simultaneously-encoded input words is not limited. For example, when the error correction encoder 100 is configured to encode k input words simultaneously (k is a positive integer), k input nodes, k first encoders, k second encoders, k output nodes, k first parity output nodes, and k second parity output nodes may be provided to the error correction encoder 100. Additionally, the interleaver 130 may include k input nodes and k output nodes. For example, the interleaver 130 may be applied to convert k input words into k interleaved words.

Figure 2:
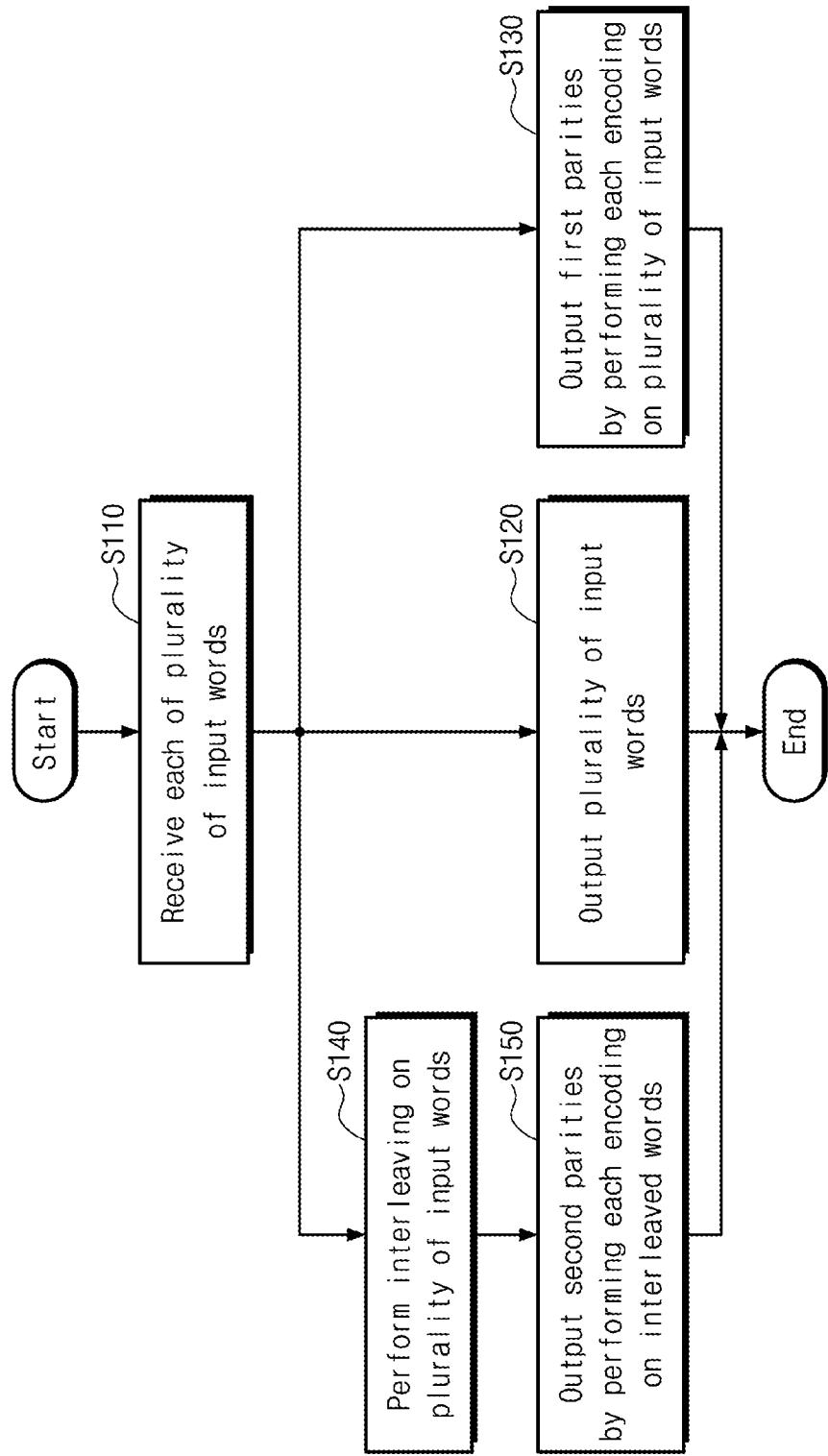
FIG. 2 is a flowchart illustrating a method of an error correction encoder of FIG. 1 to perform error correction encoding.

FIG. 2 is a flowchart illustrating a method of the error correction encoder 100 of FIG. 1 to perform error correction encoding. Referring to FIGS. 1 and 2, in operation S110, the error correction encoder 100 may receive the plurality of input words IW1 to IW4 from the plurality of input nodes I1 to I4.

After the plurality of input words IW1 to IW4 are received, operation S120, operation S130, operation S140, and operation S150 are performed in parallel.

In operation S120, the error correction encoder 100 may output the plurality of input words IW1 to IW4 from the plurality of output nodes O1 to O4.

In operation S130, the error correction encoder 100 may generate the plurality of first parities P11 to P14 by performing a first error correction encoding on the plurality of input words IW1 to IW4 in the respective first encoders 121 to 124. The plurality of first parities P11 to P14 may be outputted from the plurality of first parity output nodes 161 to 164.

In operation S140, the error correction encoder 100 may generate a plurality of interleaved words IV1 to IV4 by performing interleaving on the plurality of input words IW1 to IW4 in the interleaver 130. In operation S150, the error correction encoder 100 may generate a plurality of second parities P21 to P24 by performing a second error correction encoding on the plurality of interleaved words IV1 to IV4 in the respective second encoders 141 to 144. The plurality of second parities P21 to P24 may be outputted from the plurality of second parity output nodes 171 to 174.

The plurality of input words IW1 to IW4, the plurality of first parities P11 to P14, and the plurality of second parities P21 to P24 may form the plurality of output words OW1 to OW4 and may be transmitted through a wire or wireless channel.

Figure 3:
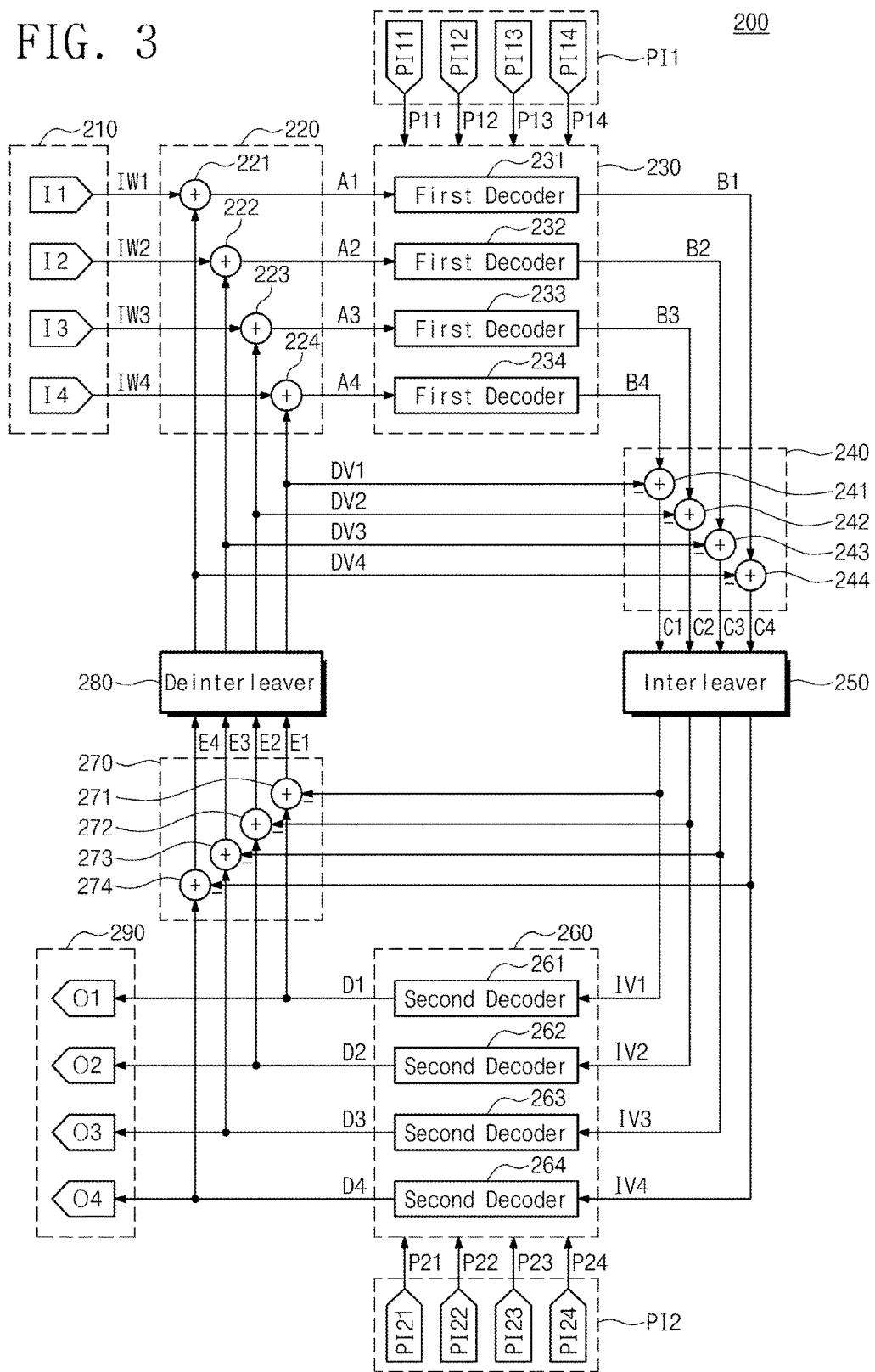
FIG. 3 is a block diagram illustrating an error correction decoder according to embodiments of the inventive concept.

FIG. 3 is a block diagram illustrating an error correction decoder 200 according to an embodiment of the inventive concept. Exemplarily, the error correction decoder 200 for performing error correction decoding during an error correction process is shown in FIG. 3. Referring to FIG. 3, the error correction decoder 200 includes an input unit 210, a first adding unit 220, a first decoding unit 230, a second adding unit 240, an interleaver 250, a second decoding unit 260, a third adding unit 270, a deinterleaver 280, an output unit 290, a first parity input unit PI1, and a second parity input unit PI2.

The input unit 210 includes a plurality of input nodes I1 to I4. The plurality of input nodes I1 to I4 receive a plurality of input words IW1 to IW4. The plurality of input words IW1 to IW4 may be original data where a data source is generated among signals received through a wire or wireless channel, for example, a part corresponding to input words inputted to the error correction encoder 100 (see FIG. 1) for performing error correction encoding. The plurality of input words IW1 to IW4 may be delivered to the first adding unit 220.

The first adding unit 220 includes a plurality of first adders 221 to 224 that respectively correspond to the plurality of input words IW1 to IW4. The plurality of first adders 221 to 224 may output results, obtained by adding the plurality of first input words IW1 to IW4 and a plurality of deinterleavers DV1 to DV4 outputted from the deinterleaver 280, as a plurality of first sum signals A1 to A4. Exemplarily, if the deinterleaver 280 does not output valid deinterleavers DV1 to DV4, the plurality of first adders 221 to 224 may output the plurality of first input words IW1 to IW4 as the plurality of first sum signals A1 to A4, respectively. The plurality of first sum signals A1 to A4 are delivered to the first decoding unit 230.

The first parity input unit PI1 includes a plurality of first parity input nodes PI11 to PI14. The plurality of first parity input nodes PI11 to PI14 receive a plurality of first parities P11 to P14. The plurality of first parities P11 to P14 may be first parities where input words are encoded among signals received through a wire or wireless channel, for example, a part corresponding to first parities outputted from the first error correction encoders 121 to 124 (see FIG. 1). The plurality of first parities P11 to P14 may be delivered to the first decoding unit 230.

The first decoding unit 230 includes a plurality of first decoders 231 to 234 that respectively correspond to the plurality of first sum signals A1 to A4. Exemplarily, the plurality of first decoders 231 to 234 may perform a first error correction decoding on each of the plurality of first sum signals A1 to A4 by using the plurality of first parities P11 to P14. For example, the plurality of first parities P11 to P14 and the plurality of first sum signals A1 to A4 may have one-to-one corresponding relationship. According to the one-to-one corresponding relationship, the plurality of first decoders 231 to 234 may perform error correction decoding on a related first sum signal by using a related first parity. For example, each of the plurality of first decoders 231 to 234 may perform iterative error correction decoding. For example, each of the first decoders 231 to 234 may perform Low Density Parity Check (LDPC) decoding. Each of the first decoders 231 to 234 may perform decoding iteratively until the number of decoding reaches a predetermined reference value. The decoding results of the first decoders 231 to 234 may be delivered as first intermediate signals B1 to B4 to the second adding unit 240.

The second adding unit 240 includes a plurality of second adders 241 to 244 that respectively correspond to the plurality of first decoders 231 to 234. The plurality of second adders 241 to 244 may output results, obtained by subtracting the outputs of the deinterleavers DV1 to DV4 outputted from the deinterleaver 280 from the plurality of first intermediate signals B1 to B4, as a plurality of second sum signals C1 to C4. Exemplarily, if the deinterleaver 280 does not output valid deinterleavers DV1 to DV4, the plurality of second adders 241 to 244 may output the plurality of first intermediate signals B1 to B4 as a plurality of second sum signals C1 to C4. The plurality of second sum signals C1 to C4 are delivered to the interleaver 250.

The interleaver 250 may generate a plurality of interleaved words IV1 to IV4 by performing interleaving on the plurality of second sum signals C1 to C4. For example, the interleaver 250 may generate one interleaved word by extracting a part from each of the plurality of second sum signals C1 to C4. One interleaved word may include parts of each of the plurality of second sum signals C1 to C4. Exemplarily, the number of the second sum signals C1 to C4 inputted to the interleaver 250 and the number of the interleaved words IV1 to IV4 outputted from the interleaver 250 may be the same. That is, the number of input nodes and the number of output nodes in the interleaver 250 may be the same. The plurality of interleaved words IV1 to IV4 outputted from the interleaver 250 are delivered to the second decoding unit 260 and the third adding unit 270.

The second parity input unit PI2 includes a plurality of second parity input nodes PI21 to PI24. The plurality of second parity input nodes PI21 to PI24 receive a plurality of second parities P21 to P24. The plurality of second parities P21 to P24 may be second parities where interleaved words are encoded among signals received through a wire or wireless channel, for example, a part corresponding to second parities outputted from the second error correction encoders 141 to 144 (see FIG. 1). The plurality of second parities P21 to P24 may be delivered to the second decoding unit 260.

The second decoding unit 260 includes a plurality of second decoders 261 to 264 that respectively correspond to the plurality of interleaved words IV1 to IV4. Exemplarily, the plurality of second decoders 261 to 264 may perform a second error correction decoding on each of the plurality of interleaved words IV1 to IV4 by using the plurality of second parities P21 to P24. For example, the plurality of second parities P21 to P24 and the plurality of interleaved words IV1 to IV4 may have one-to-one corresponding relationship. According to the one-to-one corresponding relationship, the plurality of second decoders 261 to 264 may perform error correction decoding on a related interleaved word by using a related second parity. For example, each of the plurality of second decoders 261 to 264 may perform iterative error correction decoding. For example, each of the second decoders 261 to 264 may perform Low Density Parity Check (LDPC) decoding. Each of the second decoders 261 to 264 may perform decoding iteratively until the number of decoding reaches a predetermined reference value. The decoding results of the second decoders 261 to 264 may be delivered as second intermediate signals D1 to D4 to the third adding unit 270 and the output unit 290.

The third adding unit 270 includes a plurality of third adders 241 to 274 that respectively correspond to the plurality of second decoders 261 to 264. The plurality of third adders 271 to 274 may output results, obtained by subtracting the outputs of the interleaved words IV1 to IV4 outputted from the interleaver 250 from the plurality of second intermediate signals D1 to D4, as a plurality of third sum signals E1 to E4. The plurality of third sum signals E1 to E4 are delivered to the deinterleaver 280.

The deinterleaver 280 may generate a plurality of deinterleaved words DV1 to DV4 by performing deinterleaving on the plurality of third sum signals E1 to E4. For example, the deinterleaver 280 may generate one deinterleaved word by extracting a part from each of the plurality of third sum signals E1 to E4. One deinterleaved word may include parts of each of the plurality of third sum signals E1 to E4. Exemplarily, the number of the third sum signals E1 to E4 inputted to the deinterleaver 280 and the number of the deinterleaved words DV1 to DV4 outputted from the deinterleaver 280 may be the same. That is, the number of input nodes and the number of output nodes in the deinterleaver 280 may be the same. The plurality of deinterleaved words DV1 to DV4 outputted from the deinterleaver 280 are delivered to the first adding unit 220 and the second adding unit 240.

Exemplarily, the interleaver 150 and the deinterleaver 280 may have a symmetric structure. For example, when first signals are inputted to the interleaver 250 and the outputs of the interleaver 250 are inputted to the deinterleaver 280, the first signals may be outputted from the deinterleaver 280. For example, when first signals are inputted to the interleaver 250 and the outputs of the interleaver 250 are inputted to the deinterleaver 280, the first signals may be outputted from the deinterleaver 280.

The output unit 290 includes a plurality of output nodes O1 to O4 that respectively correspond to the plurality of second intermediate signals D1 to D4. When the number of outputting the second intermediate signals D1 to D4 by the plurality of second decoders 261 to 264, or the number of delivering the second intermediate signals D1 to D4 to the third adders 271 to 274 reaches a reference value, the plurality of output nodes O1 to O4 may output the second intermediate signals D1 to D4 as final output signals, respectively. The final output signals may be delivered to a data sink that is to receive data.

As mentioned above, the error correction decoder 200 according to an embodiment of the inventive concept is configured to perform error correction decoding in parallel on a plurality of input words. Although it is shown in FIG. 3 that error correction decoding is performed on four input words IW1 to IW4, the number of simultaneously-decoded input words is not limited. For example, when the error correction decoder 200 is configured to decode k input words simultaneously (k is a positive integer), k input nodes, k first parity input nodes, k second parity input nodes, k first adders, k first decoders, k second adders, k second decoders, k third adders, and k output nodes may be provided to the error correction decoder 200. Additionally, the interleaver 250 may include k input nodes and k output nodes. For example, the interleaver 250 may be applied to convert k second sum signals into k interleaved words. Additionally, the deinterleaver 850 may include k input nodes and k output nodes. For example, the deinterleaver 280 may be applied to convert k third sum signals into k deinterleaved words.

Figure 4:
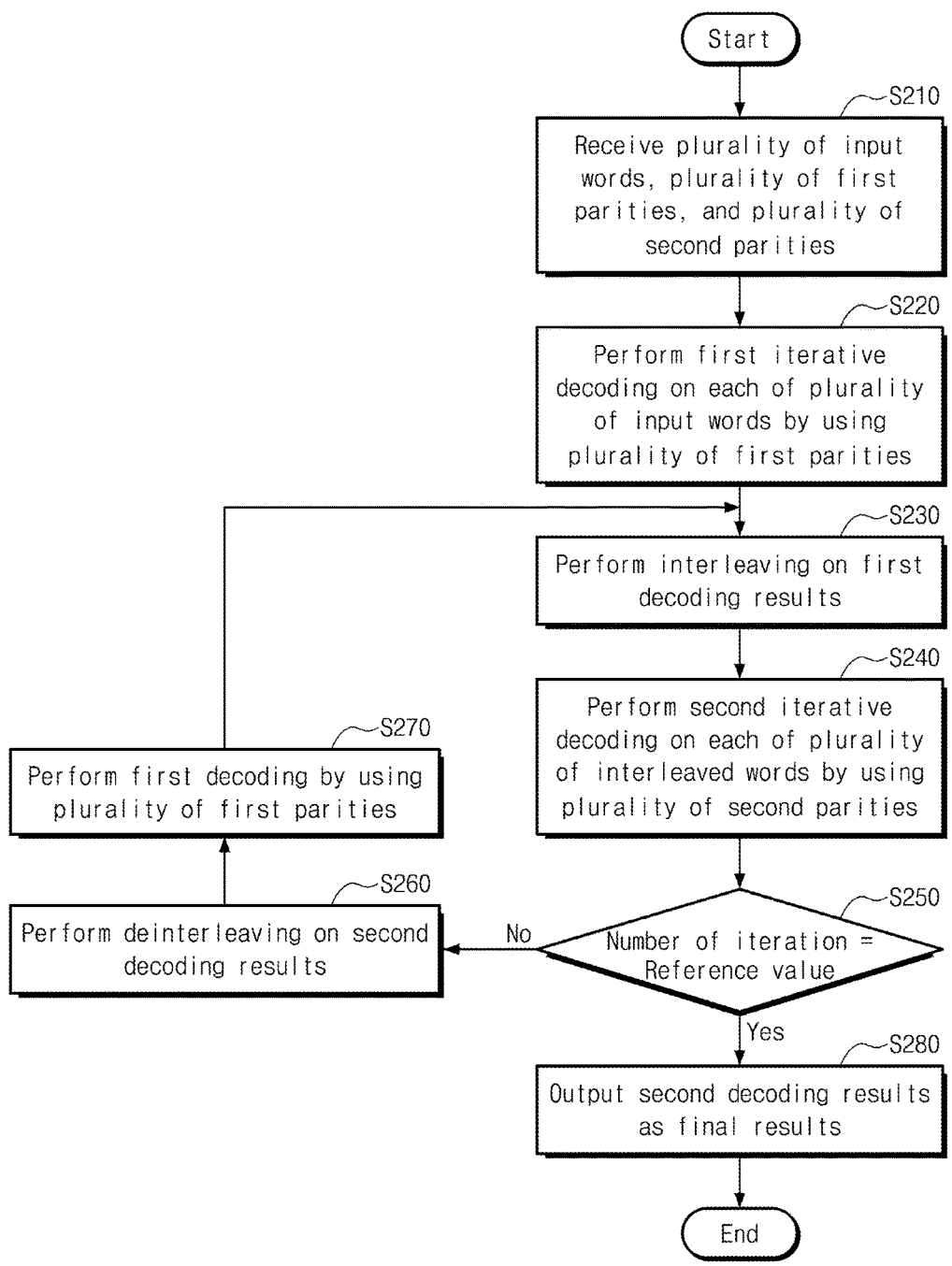
FIG. 4 is a flowchart illustrating a method of an error correction decoder of FIG. 3 to perform error correction decoding.

FIG. 4 is a flowchart illustrating a method of the error correction decoder 200 of FIG. 3 to perform error correction decoding. Referring to FIGS. 3 and 4, in operation S210, in relation to the error correction decoder 200, the plurality of input nodes I1 to I4 receive the plurality of input words IW1 to IW4; the plurality of first parity input nodes PI11 to PI14 receive the plurality of first parities P11 to P14; and the plurality of second parity input nodes PI21 to PI22 receive the plurality of second parities P21 to P24.

Before the third sum signals E1 are provided to the deinterleaver 280, the deinterleaver 280 does not output valid deinterleaved words DV1 to DV4. Accordingly, the first adders 221 to 224 may output the plurality of input words IW1 to IW4 as the first sum signals A1 to A4.

In operation S220, the first decoders 231 to 234 may perform a first error correction decoding on each of the plurality of input words IW1 to IW4 by using the plurality of first parities P11 to P14. For example, the first error correction decoding may be LDPC decoding for performing decoding iteratively. A result of the first error correction decoding may be outputted as the first intermediate signals B1 to B4.

Before the third sum signals E1 are provided to the deinterleaver 280, the deinterleaver 280 does not output valid deinterleaved words DV1 to DV4. Accordingly, the second adders 241 to 244 may output the plurality of first intermediate signals B1 to B4 as the second sum signals C1 to C4.

In operation S230, the interleaver 250 may perform interleaving on the results of the first error correction decoding outputted through the second adders 241 to 244 from the first decoders 231 to 234. The interleaved words IV1 to IV4 are delivered to the second decoders 261 to 264 and the third adders 271 to 274.

In operation S240, the second decoders 261 to 264 may perform a second error correction decoding on each of the plurality of interleaved words IV1 to IV4 by using the plurality of second parities P21 to P24. For example, the second error correction decoding may be LDPC decoding for performing decoding iteratively. A result of the second error correction decoding may be outputted as the second intermediate signals D1 to D4. The second intermediate signals D1 to D4 are delivered to the third adders 271 to 274 and the output nodes O1 to O4.

Exemplarily, performing error correction decoding once by the first decoders 231 to 234 and the second decoders 261 to 264 may form one error correction loop.

In operation S250, it is determined whether the number of iterations reaches a reference value. For example, the second decoders 261 to 264 may determine whether the number of outputting the second intermediate signals D1 to D4 reaches the reference value. If the number of iterations does not reach the reference value, the third adders 271 to 274 may calculate values obtained by subtracting the interleaved words IV1 to IV4 inputted to the second decoders 261 to 264 from the second intermediate signals D1 to D4 outputted from the second decoders 261 to 264. For example, the third adders 271 to 274 may calculate the degree of fault or error reduction (or improvement) by the second decoders 261 to 264 between the interleaved words IV1 to IV4 and the second intermediate signals D1 to D4 to output it as the third sum signals E1 to E4.

In operation S260, the deinterleaver 280 may perform deinterleaving on the third sum signals E1 to E4 delivered from the second decoders 261 to 264 through the third adders 271 to 274, that is, the results of the second error correction decoding. The deinterleaver 280 may output the result of the deinterleaving as the deinterleaved words DV1 to DV4.

The first adders 221 to 224 may add the input words IW1 to IW4 and the deinterleaved words DV1 to DV4, respectively. That is, the first adders 221 to 224 may add a result that a fault or error of the input words IW1 to IW4 is reduced or improved by the first decoders 231 to 234 and the second decoders 261 to 264 and the input words IW1 to IW4. That is, the first sum signals A1 to A4 outputted from the first adders 221 to 224 may be values that a fault or an error is reduced or improved in the input words IW1 to IW4. For example, values where a fault or an error is reduced or improved may be correction values.

In operation S270, the first decoders 231 to 234 may perform a first error correction decoding on the plurality of first sum signals A1 to A4 by using the first parities P11 to P14.

The second adders 241 to 244 may output values, obtained by subtracting the deinterleavers DV1 to DV4 from the first intermediate signals B1 to B4 outputted from the first decoders 231 to 234, as the second sum signals C1 to C4. For example, the inputs of the first decoders 231 to 234 may include the input words IW1 to IW4 and correction values calculated in the first error correction loop. The outputs of the first decoders 231 to 234 include the input words IW1 to IW4, correction values of a first error correction loop, and correction values of the first decoders 231 to 234 of a second error correction loop. Since the correction values of the first decoders 231 to 234 of the second error correction loop are based on the input words IW1 to IW4 and the correction values of the first error correction loop, they are more improved values than the correction values of the first error correction loop based on the input words IW1 to IW4.

When the second adders 241 to 244 subtract the deinterleavers DV1 to DV4 from the first intermediate signals B1 to B4, the second sum signals C1 to C4 include input words and correction values calculated by the first decoders 231 to 234 in the second error correction loop. That is, the second sum signals C1 to C4 include values where correction values improved by the first decoders 231 to 234 in the second error correction loop are applied to the input words IW1 to IW4 based on the correction values of the first error correction loop.

In operation S230, the interleaver 250 performs interleaving on the second sum signals C1 to C4.

In operation S240, the second decoders 261 to 264 perform second error correction decoding on the interleaved words IV1 to IV4.

In operation S250, if the number of iterations does not reach the reference value, the correction values of the second error correction loop are calculated by the third adders 271 to 274. The correction values of the second error correction loop may be reflected on the input words IW1 to IW4 by the first adders 221 to 224. If the number of iterations reaches the reference value, in operation S280, the second intermediate signals D1 to D4 are outputted as final outputs through the output nodes O1 to O4.

As described with reference to FIGS. 1 to 4, the error correction encoder 100 is configured to perform error correction encoding in parallel on a plurality of input words at the same time. Accordingly, an encoding speed of the error correction encoder 100 is improved. Additionally, the error correction decoder 200 is configured to perform error correction decoding in parallel on a plurality of input words at the same time. Accordingly, a decoding speed of the error correction decoder 200 is improved.

Additionally, the error correction encoder 100 performs error correction encoding to allow the error correction decoder 200 to perform error correction loops iteratively and also the first error correction decoding and the second error correction decoding iteratively in each error correction loop. Additionally, the error correction decoder 200 increases the error correction ability of error correction decoding by performing error correction loops iteratively. Additionally, the error correction decoder 200 performs the first error correction decoding and the second error correction decoding of each error correction loop through iterative decoding. Accordingly, the error correction ability of error correction decoding is further improved. Furthermore, it is known that error correction encoding and decoding schemes for correcting errors through iterative decoding have error floor. As described with reference to FIGS. 1 to 4, if the error correction encoding and decoding schemes for correcting errors through iterative decoding are configured hierarchically, error floors of the error correction encoder 100 and the error correction decoder 200 may be further lowered than an existing single error correction channel encoder and decoder.

The error correction encoder 100 performs interleaving that mixes different input words in an error correction encoding process. Additionally, the error correction decoder 200 performs interleaving that mixes different input words and deinterleaving in an error correction encoding process. Since different input words refer to each other and are used for error correction, error correction ability is further improved.

Figure 5:
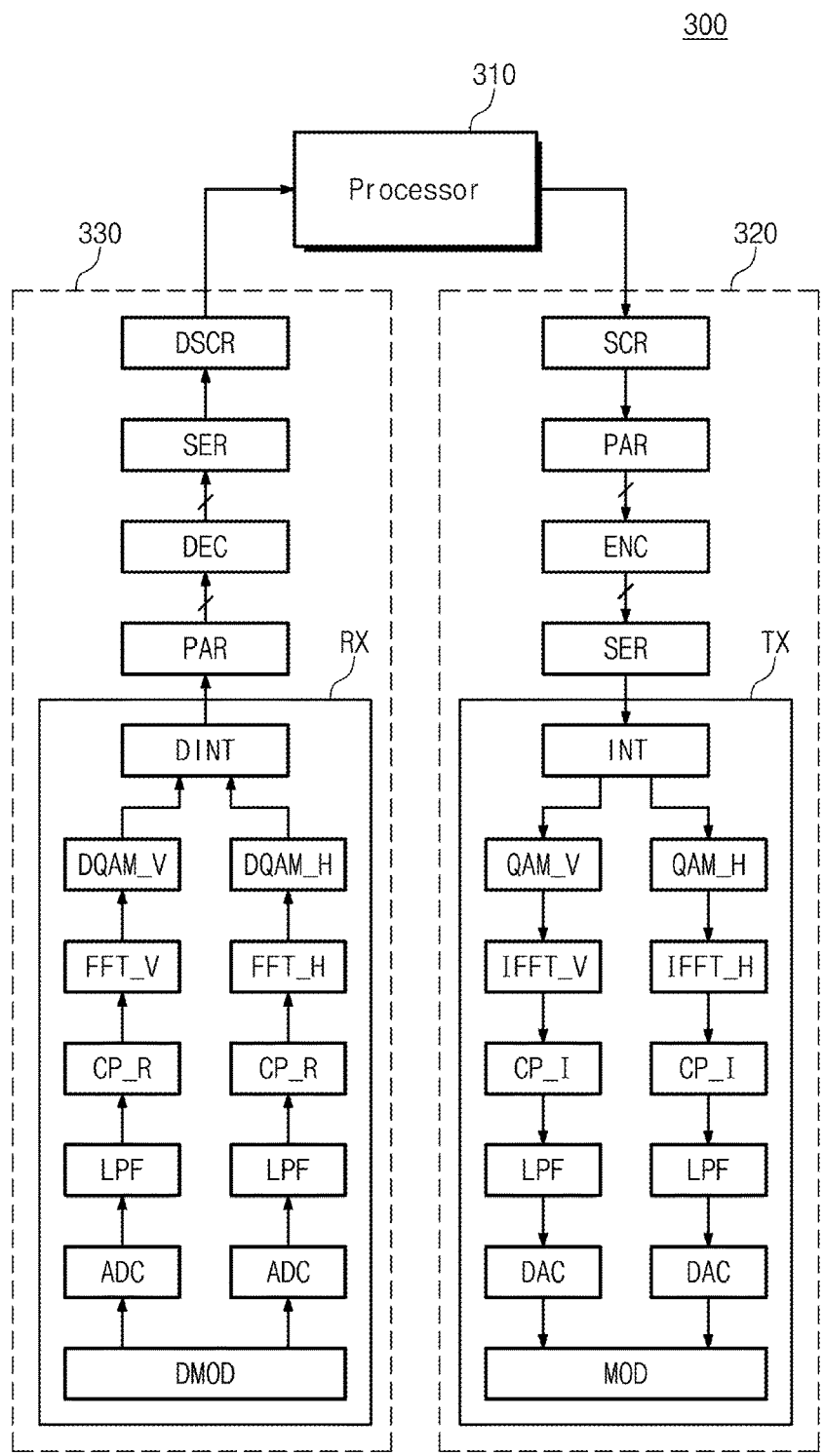
FIG. 5 is a block diagram illustrating an optical communication device according to embodiments of the inventive concept.

FIG. 5 is a block diagram illustrating an optical communication device 300 according to embodiments of the inventive concept. Referring to FIG. 5, the optical communication device 300 includes a processor 310, a transmitter 320, and a receiver 330.

The processor 310 may be a data source for transmitting data through the transmitter 320 or a data sink for receiving data through the receiver 330.

The transmitter 320 is configured to convert a transmission signal outputted from the processor 310 into an optical signal and transmit the optical signal. The transmitter 320 includes a scrambler SCR, a parallelizer PAR, an error correction encoder ENC, a serializer SER, and a transmission module TX.

The scrambler SCR may perform scramble on a transmission signal outputted from the processor 310. For example, the scramble may be an operation for converting a signal to allow the number of logical bits of '1' and the number of logical bits of '0' in the signal to be similar.

The parallelizer PAR may divide a scrambled signal into a plurality of signals. For example, the parallelizer PAR may receive a scrambled serial signal and output a first part of the serial signal as a first signal, a second part as a second signal, and a kth part as a kth signal in parallel (or simultaneously).

The error correction encoder ENC is configured to perform error correction encoding on parallel signals. Exemplarily, the error correction encoder ENC may include the error correction encoder 100 described with reference to FIG. 1.

The serializer SER may convert error-correction-encoded signals into serial signals. For example, the serializer SER outputs a first error-correction-encoded signal and then, outputs a second-error-correction-encoded signal and then, outputs a kth-error-correction-encoded signal. The serializer SER may deliver a serial signal to the transmission module TX.

The transmission module TX includes a horizontal quadrature amplitude modulator QAM_H, a vertical quadrature amplitude modulator QAM_V, a horizontal inverse fast Fourier transformer IFFT_H, a vertical inverse fast Fourier transformer IFFT_V, a cyclic prefix inserters CP_I, low pass filters LPF, digital-analog converts DAC, and a modulator MOD.

The interleaver INT may divide an input signal into a horizontal or in-phase component and a vertical or quadrature phase component. The horizontal quadrature amplitude modulator QAM_H may perform quadrature amplitude modulation on the horizontal component and the vertical quadrature amplitude modulator QAM_V performs quadrature amplitude modulation on the vertical component. The vertical inverse fast Fourier transformer IFFT_H may perform inverse fast Fourier transformation on the horizontal component and the vertical inverse fast Fourier transformer IFFT_V performs inverse fast Fourier transformation on the vertical component. The cyclic prefix inserters CP_I may an insert cyclic prefix into the vertical component and the horizontal component. The low pass filters LPF may perform filtering on the vertical component and the horizontal component. The digital-analog converts DAC may perform analog conversion on the vertical component and the horizontal component. The modulator MOD may modulate an optical signal by using the vertical component and the horizontal component. The modulated optical signal may be transmitted to an optical line.

The receiver 330 is configured to convert an optical signal received from a wire or wireless channel into an electrical signal to deliver it to the processor 310. The receiver 330 includes a descrambler DSCR, a serializer SER, an error correction decoder DEC, a parallelizer PAR, and a reception module RX.

The reception module TX includes a horizontal quadrature amplitude demodulator DQAM_H, a vertical quadrature amplitude demodulator DQAM_V, a horizontal fast Fourier transformer FFT_H, a vertical fast Fourier transformer FFT_V, a cyclic prefix removers, CP_R), low pass filters LPF, analog-digital converters ADC, and a demodulator DMOD.

The demodulator DMOD may demodulate an optical signal received through a wire or wireless channel to obtain an electrical signal. The electrical signal is divided into a vertical component and a horizontal component and outputted in parallel. The analog-digital converts ADC may perform digital conversion on the vertical component and the horizontal component. The low pass filters LPF may perform filtering on the vertical component and the horizontal component. The cyclic prefix removers CP_R may remove a cyclic prefix from the vertical component and the horizontal component. The horizontal fast Fourier transformer FFT_H may perform fast Fourier transformation on the horizontal component and the vertical fast Fourier transformer IFFT_V performs fast Fourier transformation on the vertical component. The horizontal quadrature amplitude demodulator DQAM_H may perform quadrature amplitude demodulation on the horizontal component and the vertical quadrature amplitude demodulator DQAM_V performs quadrature amplitude demodulation on the vertical component. The deinterleaver DINT may combine the vertical component and the horizontal component to output as a serial signal.

The parallelizer PAR may divide the serial signal into a plurality of signals. For example, the parallelizer PAR may receive a scrambled serial signal and output a first part of the serial signal as a first signal, a second part as a second signal, and a kth part as a kth signal in parallel (or simultaneously).

The error correction decoder DEC is configured to perform error correction decoding on parallel signals. Exemplarily, the error correction decoder DEC may include the error correction decoder 200 described with reference to FIG. 3.

The serializer SER may convert error-correction-decoded signals into serial signals. For example, the serializer SER outputs a first error-correction-decoded signal and then, outputs a second-error-correction-decoded signal and then, outputs a kth-error-correction-decoded signal. The serializer SER may deliver a serial signal to the transmission module TX.

The descrambler DSCR may perform descramble that is an inverse operation of scramble performed by the scrambler SCR.

Figure 6:
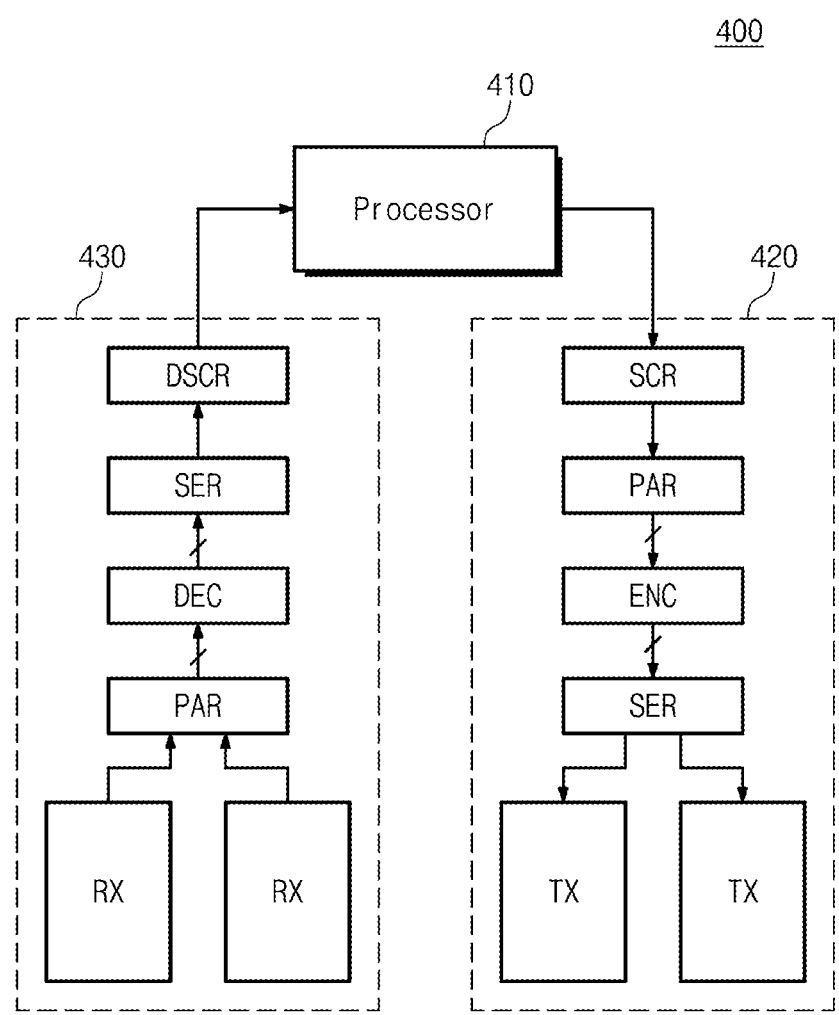
FIG. 6 is a block diagram illustrating an optical communication device according to an application example of the inventive concept.

FIG. 6 is a block diagram illustrating an optical communication device 400 according to an application example of the inventive concept. Referring to FIG. 6, the optical communication device 400 includes a processor 410, a transmitter 420, and a receiver 430.

Compared to the optical communication device 300 of FIG. 5, the transmitter 420 of the optical communication device 400 includes two transmission modules TX. Additionally, the receiver 430 of the optical communication device 400 includes two reception modules RX. Each of the transmission modules TX may have the same structure as the transmission module TX of FIG. 5 and each of the reception modules RX may have the same structure as the reception module RX of FIG. 5

The serializer SER of transmitter 420 may convert a plurality of parallel signals into two signals. For example, as described with reference to FIG. 1, when the error correction encoder ENC outputs four output words OW1 to OW4, the serializer SER may convert two output words into one serial signal and the remaining two output words into another serial signal. Two serial signals may be parallel to each other. Each serial signal may be transmitted to a wire or wireless channel through the transmission module TX. That is, it may be interpreted that the serializer SER converts four parallel signals into two parallel signals.

The parallelizer PAR of the receiver 430 receives serial signals from a plurality of reception modules RX, respectively. The parallelizer PAR may convert a serial signal received from each reception module RX into two or more parallel signals. For example, as described with reference to FIG. 3, when the error correction decoder DEC performs error correction decoding based on four input words IW1 to OW4, the parallelizer PAR may convert a serial signal received from each reception module RX into two parallel signals. Serial signals received from each reception module RX may be parallel to each other. That is, it may be interpreted that the parallelizer PAR converts two parallel signals into four parallel signals.

Figure 7:
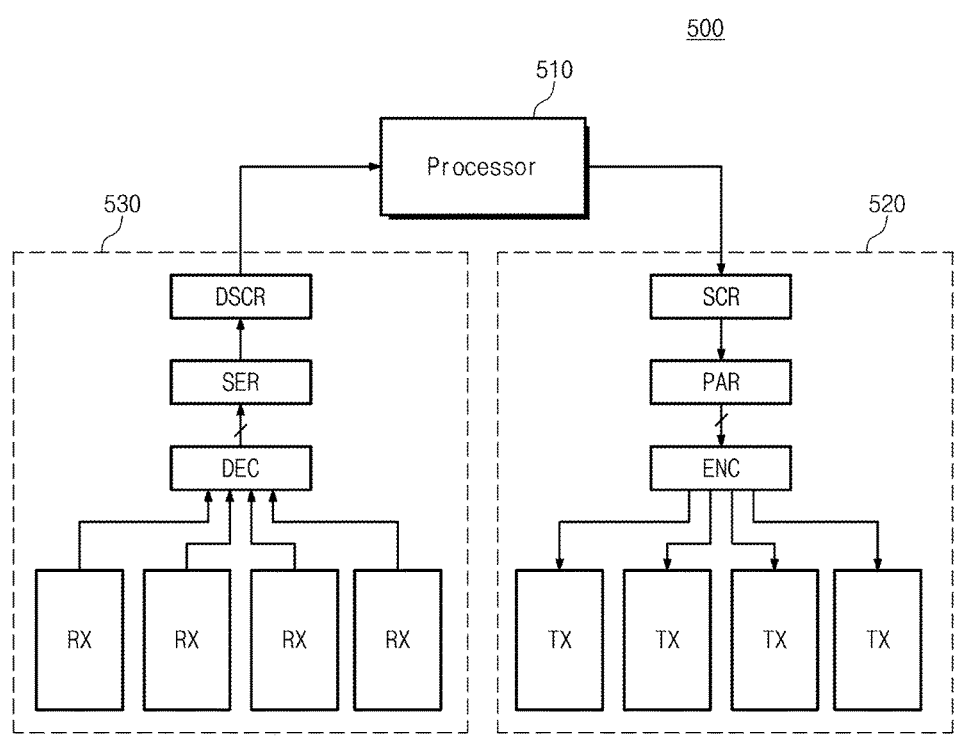
FIG. 7 is a block diagram illustrating an optical communication device according to an application example of the inventive concept.

FIG. 7 is a block diagram illustrating an optical communication device 500 according to an application example of the inventive concept. Referring to FIG. 7, the optical communication device 500 includes a processor 510, a transmitter 520, and a receiver 530.

Compared to the optical communication device 300 of FIG. 5, the transmitter 520 of the optical communication device 500 includes four transmission modules TX. Additionally, the receiver 530 of the optical communication device 500 includes four reception modules RX. Each of the transmission modules TX may have the same structure as the transmission module TX of FIG. 5 and each of the reception modules RX may have the same structure as the reception module RX of FIG. 5

Compared to the optical communication device 300 of FIG. 5, the transmitter 520 of the optical communication device 500 does not include a serializer. Exemplarily, when the number of the output words OW1 to OW4 of the error correction encoder ENC and the number of transmission modules TX are the same, a serializer is not provided to the transmitter 520.

Compared to the optical communication device 300 of FIG. 5, the receiver 530 of the optical communication device 500 does not include a parallelizer. Exemplarily, when the number of the input words IW1 to IW4 of the error correction decoder DEC and the number of reception modules RX are the same, a parallelizer is not provided to the receiver 530.

Figure 8:
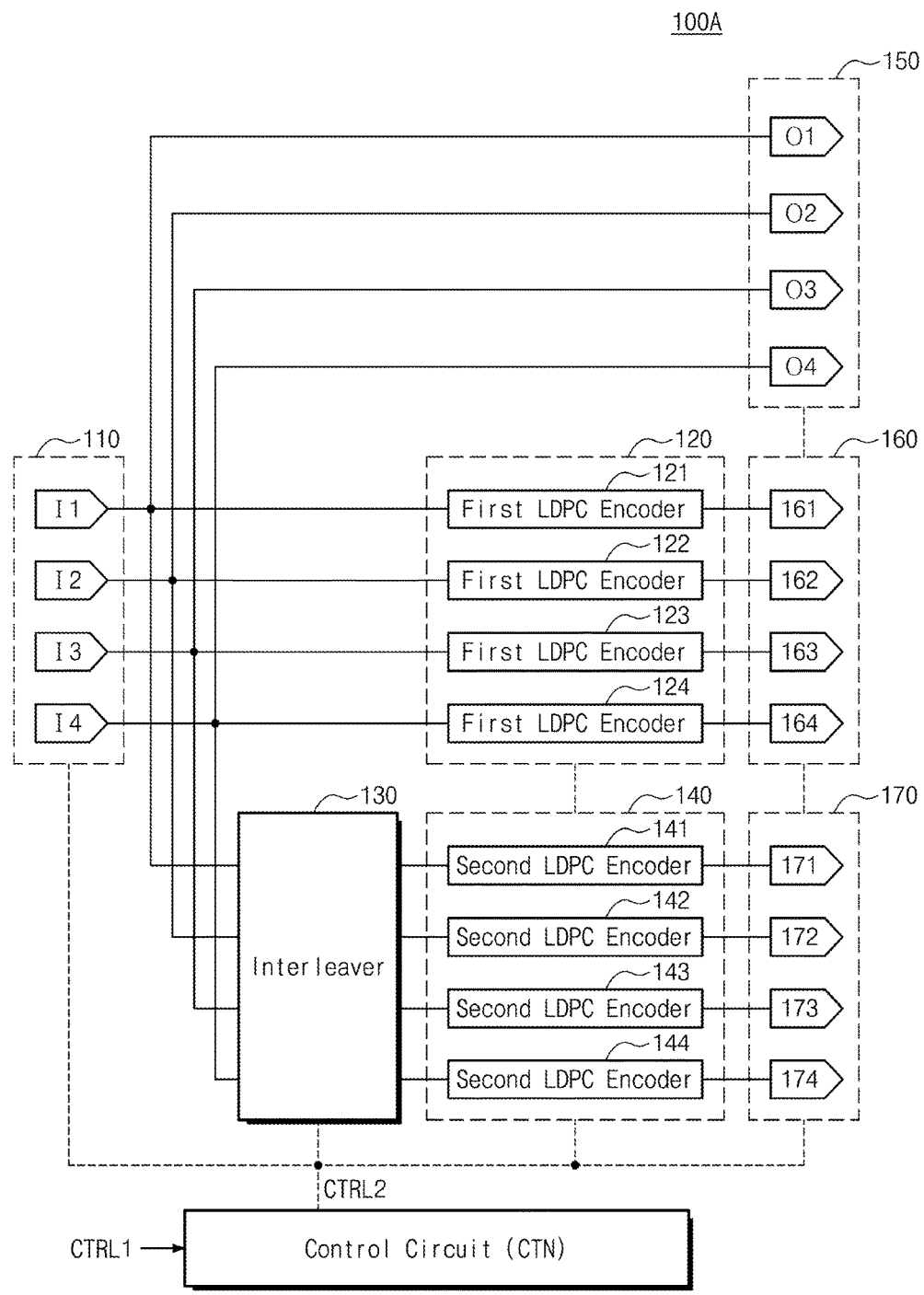
FIG. 8 illustrates an application example of an error correction encoder of FIG. 1.

FIG. 8 illustrates an application example of the error correction encoder 100 of FIG. 1. Exemplarily, some of the reference symbols shown in FIG. 1 are omitted in FIG. 8 in order to avoid complicating the drawing.

Compared to the error correction encoder 100 of FIG. 1, a control circuit CTN is further provided in an error correction encoder 100a of FIG. 8. The control circuit CTN outputs a second control signal CTRL2 in response to a first control signal CTRL1 received from an external device. The second control signal CTRL2 may be delivered to an input unit 110, a first encoding unit 120, an interleaver 130, a second encoding unit 140, an output unit 150, a first parity output unit 160, a second parity output unit 270, or some of them. The control circuit CTN may adjust the number of input words IW1 to IW4 that the error correction encoder 100a performs error correction encoding in parallel by using the second control signal CTRL2.

For example, by using the second control signal CTRL2, the control circuit CTN may adjust or determine all or some of the number of activation input nodes among the input nodes I1 to I4, the number of activation first encoders among the first encoders 121 to 124, the number of activation input nodes and activation output nodes among input nodes and output nodes of the interleaver 130, the number of second encoders among the second encoders 141 to 144, the number of activation output nodes among the output nodes O1 to O4, the number of activation first parity output nodes among the first parity output nodes 161 to 164, and the number of activation second parity output nodes among the second parity output nodes 171 to 174.

When the number of input words that the error correction encoder 100a performs error correction encoding in parallel is adjusted, the flexibility of the error correction encoder 100a may be improved and the cost of manufacturing a new error correction encoder may be saved.

Figure 9:
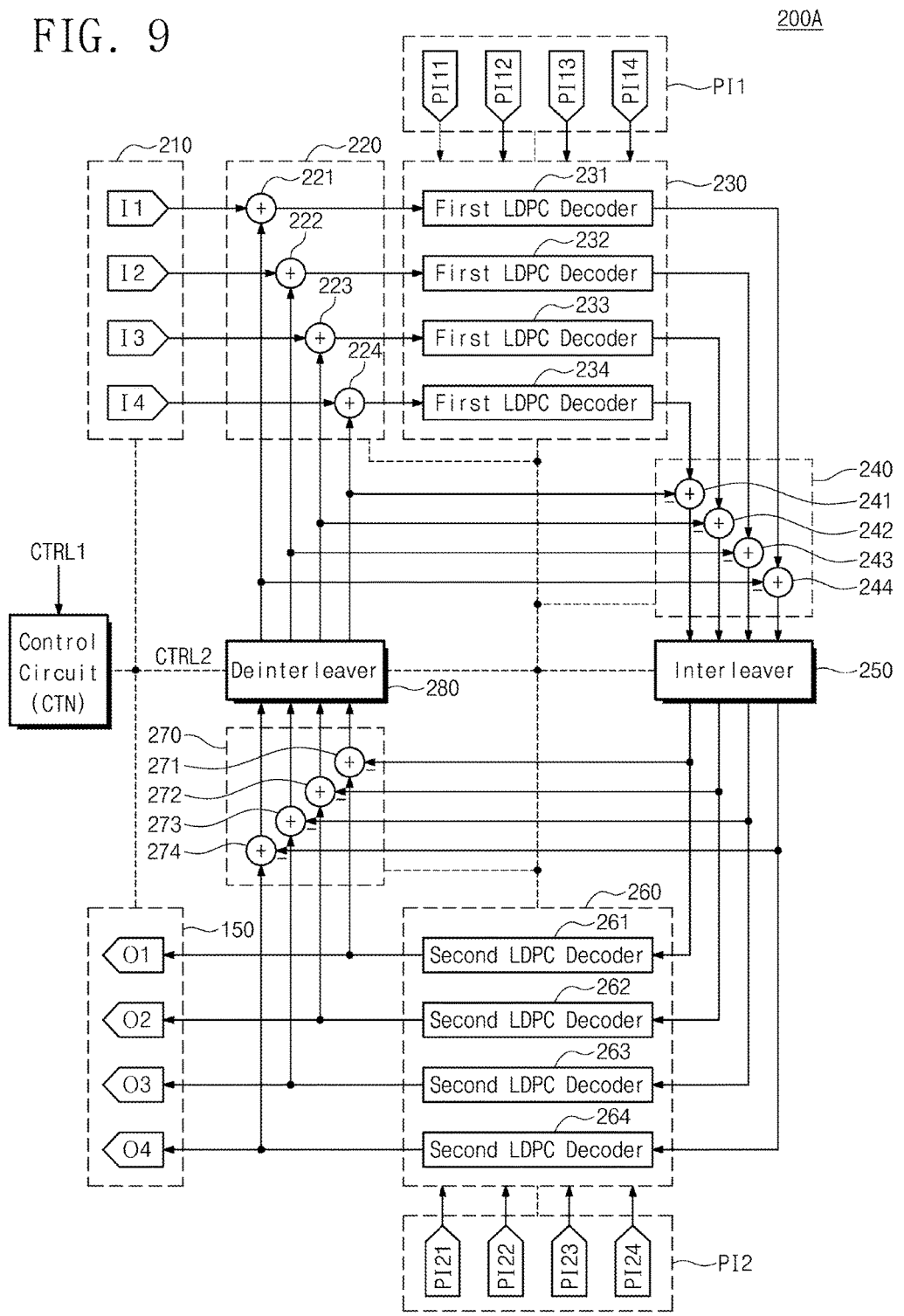
FIG. 9 illustrates an application example of an error correction decoder of FIG. 3.

FIG. 9 illustrates an application example of the error correction decoder 200 of FIG. 3. Exemplarily, some of the reference symbols shown in FIG. 3 are omitted in FIG. 9 in order to avoid complicating the drawing.

Compared to the error correction decoder 200 of FIG. 3, a control circuit CTN is further provided in an error correction decoder 200a of FIG. 9. The control circuit CTN outputs a second control signal CTRL2 in response to a first control signal CTRL1 received from an external device. The second control signal CTRL2 may be delivered to an input unit 110, a first parity input unit PI1, a second parity input unit PI2, a first adding unit 220, a first decoding unit 230, a second adding unit 240, an interleaver 250, a second decoding unit 260, a third adding unit 270, a deinterleaver 280, and an output unit 290. The control circuit CTN may adjust the number of input words IW1 to IW4 that the error correction decoder 200a performs error correction decoding in parallel by using the second control signal CTRL2.

For example, by using the second control signal CTRL2, the control circuit CTN may adjust or determine all or some of the number of activation input nodes among the input nodes I1 to I4, the number of activation first parity input nodes among the first parity input nodes PI11 to PI14, the number of activation parity input nodes among the second parity input nodes PI21 to PI24, the number of activation first adders among the first adders 221 to 224, the number of activation first decoders among the first decoders 231 to 234, the number of activation input nodes and output nodes among input nodes and output nodes of the interleaver 250, the number of activation second decoders among the second decoders 261 to 264, the number of third adders among the third adders 271 to 274, the number of activation input nodes and activation output nodes among input nodes and output nodes of the deinterleaver 280, and the number of activation output nodes among the output nodes O1 to O4.

When the number of input words that the error correction decoder 200a performs error correction decoding in parallel is adjusted, the flexibility of the error correction decoder 200a may be improved and the cost of manufacturing a new error correction decoder may be saved.

According to embodiments of the inventive concept, an error correction encoder and decoder perform a plurality of input words in parallel. Accordingly, an error correction encoder, an error correction decoder, and an optical communication device, each having an improved processing speed, are provided. Additionally, according to embodiments of the inventive concept, an error correction encoder and decoder perform interleaving on a plurality of input words and then perform iterative two-step error correction. Accordingly, an error correction encoder, an error correction decoder, and an optical communication device, each having an improved error correction function, are provided.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. An error correction encoder comprising:
   a plurality of input nodes configured to receive a plurality of input words;

a plurality of first encoders configured to generate a plurality of first parities by performing a first error correction encoding on each of the plurality of input words received through the plurality of input nodes;

an interleaver configured to generate interleaved words by performing interleaving on the plurality of input words received from the plurality of input nodes;

a plurality of second encoders configured to generate a plurality of second parities by performing a second error correction encoding on each of the plurality of interleaved words received from the interleaver;

a plurality of output nodes configured to output each of the plurality of input words received through the plurality of input nodes;

a plurality of first parity output nodes configured to output each of the plurality of first parities received from the plurality of first encoders; and a plurality of second parity output nodes configured to output each of the plurality of second parities received from the plurality of second encoders, wherein the error correction encoder further comprises a control circuit configured to adjust a number of input words on which the error correction encoder performs error correction encoding in parallel among the plurality of input words.

2. The error correction encoder of claim 1, wherein each of the first error correction encoding and the second error correction encoding comprises Low Density Parity Check (LDPC) encoding.

3. The error correction encoder of claim 1, wherein each interleaved word comprises a part of each of the plurality of input words.

4. The error correction encoder of claim 1, wherein the control circuit adjusts the number of activation first encoders among the plurality of first encoders, the number of activation second encoders among the plurality of second encoders, and the number of activation inputs and the number of activation outputs of the interleaver.

5. An error correction decoder comprising:
a plurality of input nodes configured to receive a plurality of input words;
a plurality of first error correction decoders configured to perform a first error correction decoding on each of the plurality of input words received through the plurality of input nodes by using a plurality of first parities received through a plurality of first parity input nodes; and
an interleaver configured to generate a plurality of interleaved words by performing interleaving on outputs of the plurality of first error correction decoders; and
a plurality of second error correction decoders configured to perform a second error correction decoding on each of the plurality of interleaved words received from the interleaver by using a plurality of second parities received through a plurality of second parity input nodes,
wherein the error correction decoder further comprises a controller configured to adjust a number of input words on which the error correction decoder performs error correction decoding in parallel among the plurality of input words.

6. The error correction decoder of claim 5, further comprising:
a deinterleaver configured to generate a plurality of deinterleaved words by performing deinterleaving on outputs of the plurality of second error correction decoders; and a plurality of adders configured to add the plurality of input words received through the plurality of input nodes and the plurality of deinterleaved words received from the deinterleaver, respectively, and to deliver the added results to the plurality of first error correction decoders, respectively.

7. The error correction decoder of claim 6, wherein each of the plurality of deinterleaved words comprises a part of each of outputs of the plurality of second error correction decoders.

8. The error correction decoder of claim 6, wherein the plurality of first error correction decoders are configured to perform the first error correction decoding on outputs of the plurality of adders; and
when the deinterleaver does not output the plurality of deinterleaved words, the plurality of adders are configured to deliver only the plurality of input words to the plurality of first error correction decoders, respectively.

9. The error correction decoder of claim 6, further comprising a plurality of second adders configured to deliver values, which are obtained by subtracting the plurality of deinterleaved words from outputs of the plurality of first error correction decoders, to the interleaver.

10. The error correction decoder of claim 9, wherein the interleaver is configured to perform interleaving on outputs of the plurality of second adders and when the deinterleaver does not output the plurality of deinterleaved words, the plurality of second adders are configured to deliver only the outputs of the plurality of first error correction decoders to the interleaver.

11. The error correction decoder of claim 6, further comprising a plurality of third adders configured to deliver values, which are obtained by subtracting outputs of the interleaver from the outputs of the plurality of second error correction decoders, respectively, to the deinterleaver, wherein the deinterleaver is configured to perform deinterleaving on outputs of the plurality of third adders.

12. The error correction decoder of claim 9, further comprising, when the number of times of decoding iteratively performed by the plurality of second error correction decoders reaches a reference value, a plurality of output nodes configured to output each of the outputs of the plurality of second error correction decoders to the outside.

13. The error correction decoder of claim 9, wherein the control circuit adjusts the number of activation first error correction decoders among the plurality of first error correction decoders, the number of activation inputs and activation outputs of the interleaver, the number of second error correction decoders among the plurality of second error correction decoders, and the number of activation inputs and activation outputs of the deinterleaver.

14. The error correction decoder of claim 5, wherein each of the first error correction decoding and the second error correction decoding comprises iterative decoding for performing error correction a plurality of times.

15. The error correction decoder of claim 5, wherein each of the first error correction decoding and the second error correction decoding comprises Low Density Parity Check (LDPC) decoding.

16. An optical communication device comprising:
a scrambler configured to perform scramble on a first input word;
a parallelizer configured to output a plurality of second input words by parallelizing an output of the scrambler;

an error correction encoder configured to perform error correction encoding on the plurality of second input words; and an optical transmitter configured to output an output of the error correction encoder as an optical signal, wherein the error correction encoder comprises:

a plurality of first encoders configured to generate a plurality of first parities by performing a first error correction encoding on each of the plurality of second input words;

an interleaver configured to generate a plurality of interleaved words by performing interleaving on the plurality of second input words;

a plurality of second encoders configured to generate a plurality of second parities by performing a second error correction encoding on each of the plurality of interleaved words received from the interleaver; and a controller configured to adjust a number of second input words on which the error correction encoder performs error correction encoding in parallel among the plurality of second input words, wherein the error correction encoder is configured to provide the optical transmitter with a plurality of output words that include the plurality of second input words, the plurality of first parities, and the plurality of second parities.

17. The optical communication device of claim 16, further comprising a serializer configured to output a serial signal by serializing the plurality of output words from the error correction encoder to match the number of inputs of the optical transmitter and deliver the serial signal to the optical transmitter.

18. The optical communication device of claim 16, wherein the error correction encoder is configured to output each of second input words and a first parity and a second parity corresponding to said each of second input words, as a corresponding one of the plurality of output words, to the optical transmitter.

19. The optical communication device of claim 16, further comprising:

an optical receiver configured to receive a second optical signal;

a second parallelizer configured to parallelize an output of the optical receiver to output a plurality of third input words, a plurality of third parities, and a plurality of fourth parities, the plurality of third parities corresponding to the plurality of first parities generated by the error correction encoder, the plurality of fourth parities corresponding to the plurality of second parties generated by the error correction encoder;

an error correction decoder configured to perform error correction decoding on the plurality of third input words;

a serializer configured to serialize outputs of the error correction decoder to output a fourth input word;

a descrambler configured to descramble the fourth input word output from the serializer, wherein the error correction decoder comprises:

a plurality of first error correction decoders configured to perform a first error correction decoding on each of the plurality of third input words by using the plurality of third parities;

an interleaver configured to generate a plurality of interleaved words by performing interleaving on outputs of the plurality of first error correction decoders; and a plurality of second error correction decoders configured to perform a second error correction decoding on each of the plurality of interleaved words received from the interleaver by using the plurality of fourth parities.

20. The optical communication device of claim 16, further comprising:

an optical receiver configured to receive second optical signals;

a second parallelizer configured to parallelize outputs of the optical receiver to output a plurality of third input words, a plurality of third parities, and a plurality of fourth parities, the plurality of third parities corresponding to the plurality of first parities generated by the error correction encoder, the plurality of fourth parities corresponding to the plurality of second parties generated by the error correction encoder;

an error correction decoder configured to perform error correction decoding on the plurality of third input words;

a serializer configured to serialize outputs of the error correction decoder to output a fourth input word; and a descrambler configured to descramble the fourth input word output from the serializer, wherein the error correction decoder comprises:

a plurality of first error correction decoders configured to perform a first error correction decoding on each of the plurality of third input words by using the plurality of third parities;

an interleaver configured to generate a plurality of interleaved words by performing interleaving on outputs of the plurality of first error correction decoders; and a plurality of second error correction decoders configured to perform a second error correction decoding on each of the plurality of interleaved words received from the interleaver by using the plurality of fourth parities.

* * * * *